(12) United States Patent
Li et al.

(10) Patent No.: US 9,089,052 B2
(45) Date of Patent: Jul. 21, 2015

(54) MULTICHIP MODULE WITH STIFFENING FRAME AND ASSOCIATED COVERS

(71) Applicant: International Business Machines Corporation, Armonk, NY (US)

(72) Inventors: Shidong Li, Poughkeepsie, NY (US); Gregg B. Monjeau, Wallkill, NY (US); Kamal K. Sikka, Poughkeepsie, NY (US); Hilton T. Toy, Hopewell Junction, NY (US); Thomas Weiss, Poughkeepsie, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/552,791

(22) Filed: Nov. 25, 2014

(65) Prior Publication Data

US 2015/0077944 A1  Mar. 19, 2015

Related U.S. Application Data

(62) Division of application No. 13/928,406, filed on Jun. 27, 2013.

(51) Int. Cl.
    *H05K 1/02*     (2006.01)
    *H01L 23/02*    (2006.01)
    *H01L 23/16*    (2006.01)
    (Continued)

(52) U.S. Cl.
    CPC .............. *H05K 1/0204* (2013.01); *H01L 23/02* (2013.01); *H01L 23/16* (2013.01); *H01L 23/3737* (2013.01); *H01L 23/433* (2013.01); *H01L 25/0655* (2013.01); *H05K 5/03* (2013.01); *H01L 23/36* (2013.01); *H01L 23/49816* (2013.01); *H01L 2224/16225* (2013.01); *H01L 2224/32225* (2013.01); *H01L 2224/73204* (2013.01); *H01L 2224/73253* (2013.01); *H01L 2924/15311* (2013.01)

(58) Field of Classification Search
    CPC ................. H01L 2924/00; H01L 2224/73265; H01L 2224/32225; H01L 2224/16225; H01L 2224/73253; H01L 2224/73204; H01L 2924/19105; H05K 1/141; H05K 2201/10734
    USPC .............. 257/E21.499, E23.088, E23.09, 712
    See application file for complete search history.

(56) References Cited

U.S. PATENT DOCUMENTS

| 4,413,308 A | 11/1983 | Brown |
| 5,182,632 A | 1/1993 | Bechtel et al. |

(Continued)

FOREIGN PATENT DOCUMENTS

EP    0764984 A2    3/1997

*Primary Examiner* — David Vu
*Assistant Examiner* — Jonathan Han
(74) *Attorney, Agent, or Firm* — Matthew C. Zehrer

(57) ABSTRACT

A multichip module includes a carrier, a stiffening frame, a plurality of semiconductor chips, and a plurality of covers. The carrier has a top surface and a bottom surface configured to be electrically connected to a motherboard. The stiffening frame includes a plurality of openings that accept the plurality of semiconductor chips and may be attached to the top surface of the carrier with an adhesive that absorbs dimensional changes between the stiffening frame and the carrier. The semiconductor chips are concentrically arranged within the plurality of openings of the stiffening frame and the plurality of covers are attached to the stiffening frame so as to enclose the plurality of openings.

8 Claims, 7 Drawing Sheets

(51) Int. Cl.
*H01L 25/065* (2006.01)
*H01L 23/373* (2006.01)
*H01L 23/433* (2006.01)
*H05K 5/03* (2006.01)
*H01L 23/36* (2006.01)
*H01L 23/498* (2006.01)

(56) References Cited

U.S. PATENT DOCUMENTS

| | | | |
|---|---|---|---|
| 5,904,499 A | 5/1999 | Pace | |
| 5,940,686 A | 8/1999 | Vasquez | |
| 6,208,526 B1 | 3/2001 | Griffen et al. | |
| 6,404,638 B1 | 6/2002 | Messina | |
| 6,556,455 B2* | 4/2003 | Dibene et al. | 361/785 |
| 6,703,702 B2 | 3/2004 | Inoue et al. | |
| 6,706,624 B1 | 3/2004 | Kapusta et al. | |
| 6,794,222 B1 | 9/2004 | Kraft et al. | |
| 8,324,718 B2 | 12/2012 | Honda | |
| 2005/0280140 A1* | 12/2005 | Corbin et al. | 257/706 |
| 2008/0310117 A1* | 12/2008 | Coico et al. | 361/709 |
| 2008/0316716 A1 | 12/2008 | Yang | |
| 2009/0127700 A1* | 5/2009 | Romig | 257/712 |
| 2010/0181665 A1 | 7/2010 | Casey et al. | |
| 2011/0233757 A1* | 9/2011 | O'Neill | 257/712 |
| 2012/0098116 A1 | 4/2012 | Casey et al. | |
| 2012/0241944 A1 | 9/2012 | Beaumier et al. | |
| 2013/0056863 A1 | 3/2013 | Chi et al. | |

* cited by examiner

MULTICHIP MODULE WITH STIFFENING FRAME AND ASSOCIATED COVERS

FIELD OF THE EMBODIMENTS

Embodiments of the present invention generally relate to electronic devices and more specifically to electronic device multichip modules.

DESCRIPTION OF THE RELATED ART

Though the size constrains of electronic devices are generally decreasing, the computing power of those devices are generally increasing. As such, electronic device performance will generally require higher levels of integration. One way to accomplish greater integration is to package more computing devices in a smaller area. For example, by packaging more semiconductor chips onto individual modules. Typically, a multichip module is an electronic package with multiple integrated circuits, semiconductor dies, chips, etc. packaged onto a unifying carrier or substrate.

SUMMARY

The present invention is generally directed to a multichip module. In a specific embodiment, the multichip module includes a carrier, a stiffening frame, a plurality of semiconductor chips, and a plurality of covers. The carrier may have a top surface and a bottom surface configured to be electrically connected to a motherboard. The stiffening frame may include a plurality of openings that accept the plurality of semiconductor chips and may be attached to the top surface with a compliant adhesive that absorbs thermally induced dimensional variations between the stiffening frame and the carrier. The semiconductor chips may be electrically connected to the top surface and concentrically arranged within the plurality of openings. The plurality of covers may be attached to the stiffening frame to enclose the plurality of openings.

These and other embodiments, features, aspects, and advantages will become better understood with reference to the following description, appended claims, and accompanying drawings.

BRIEF DESCRIPTION OF THE FIGURES

So that the manner in which the above recited features of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

DETAILED DESCRIPTION

Figure 1:
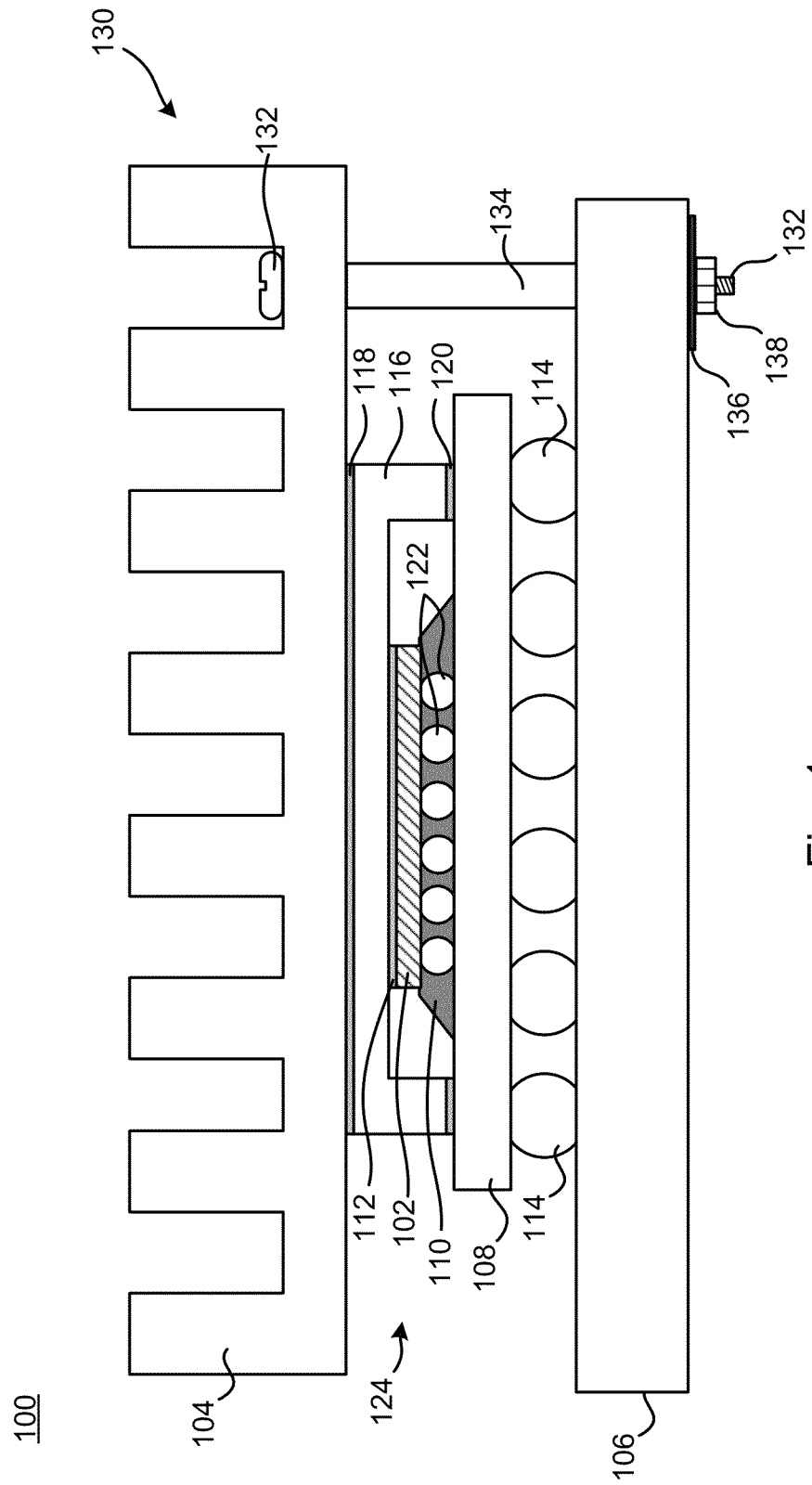
FIG. 1 depicts an electronic device utilizing a prior art single chip module.

FIG. 1 depicts a prior art electronic device 100 utilizing single chip module 124. Electronic device 100 may be for example a computer, server, mobile device, tablet, etc. Single chip module 124 includes chip 102, carrier 108, interconnects 122, underfill 110, thermal interface material 112, lid 116, and adhesive 120. Chip 102 may be an integrated circuit, semiconductor die, processor, microchip, etc. Carrier 108 may be an organic carrier or a ceramic carrier and provides mechanical support for Chip 102 and electrical paths from the upper surface of carrier 108 to the opposing side of carrier 108. Interconnects 122 electrically connect chip 102 and the upper side of carrier 108 and may be a wire bond, solder bond, stud, conductive ball, conductive button, etc. Underfill 110 may be electrically-insulating, may substantially surround interconnects 122, may isolate individual interconnects 122, and may provide mechanical support between chip 102 and carrier 108. Underfill 110 may also prevent damage to individual interconnects 122 due to thermal expansion mismatches between chip 102 and carrier 108.

When chip 102 is seated upon carrier 108, a reflow process may be performed to join interconnects 122 to electrical contacts of both chip 122 and carrier 108. After chip 102 is seated to carrier 108 a lid 116 is attached to carrier 108 with adhesive 120 to cover chip 102. Generally, during operation of electronic device 100, heat needs to be removed from chip 102. In this situation, lid 116 is both a cover and a conduit for heat transfer. As such, a thermal interface material 112 may thermally join lid 116 and chip 102.

Single chip module 124 may be connected to a motherboard 106 via interconnects 114. Motherboard 106 may be the main printed circuit board of electronic device 100 and includes electronic components, such as a graphics processing unit, memory, etc. and provides connectors for other peripherals. Interconnects 114 electrically connect the lower side of carrier 108 to motherboard 106 and may be a wire bond, solder bond, stud, conductive ball, conductive button, etc. Interconnects 114 may be larger and thus more robust than interconnects 122. When single chip module 124 is seated upon motherboard 106 a second reflow process may be performed to join interconnects 114 to electrical contacts of both carrier 108 and motherboard 106.

To assist in the removal of heat from chip 102 a heat sink 104 may be thermally joined to single chip module 124 via thermal interface material 118. Heat sink 104 may be a passive heat exchanger that cools chip 102 by dissipating heat into the surrounding air. As such, during operation of electronic device 100, a thermal path exists from chip 102 to heat sink 104 through thermal interface material 112, lid 116, and thermal interface material 118, etc. Heat sink 104 may be connected to motherboard 106 via one or more connection device 130. Connection device 130 may include a threaded fastener 132, standoff 134, backside stiffener 136, and fastener 138. Threaded fastener 132 may extend through heat sink 104, standoff 134, and backside stiffener 136 and provides compressive force between heat sink 104 and backside stiffener 136. The length of standoff 134 may be selected to limit the pressure exerted upon single chip module 124 by heat sink 104 created by the compressive forces. Backside stiffener 136 may mechanically support the compressive forces by distributing the forces across a larger area of motherboard 104. In other applications, connection device 130 may be a clamp, non-influencing fastener, cam, etc. system that adequately forces heat sink 104 upon single chip module 124.

Figure 2:
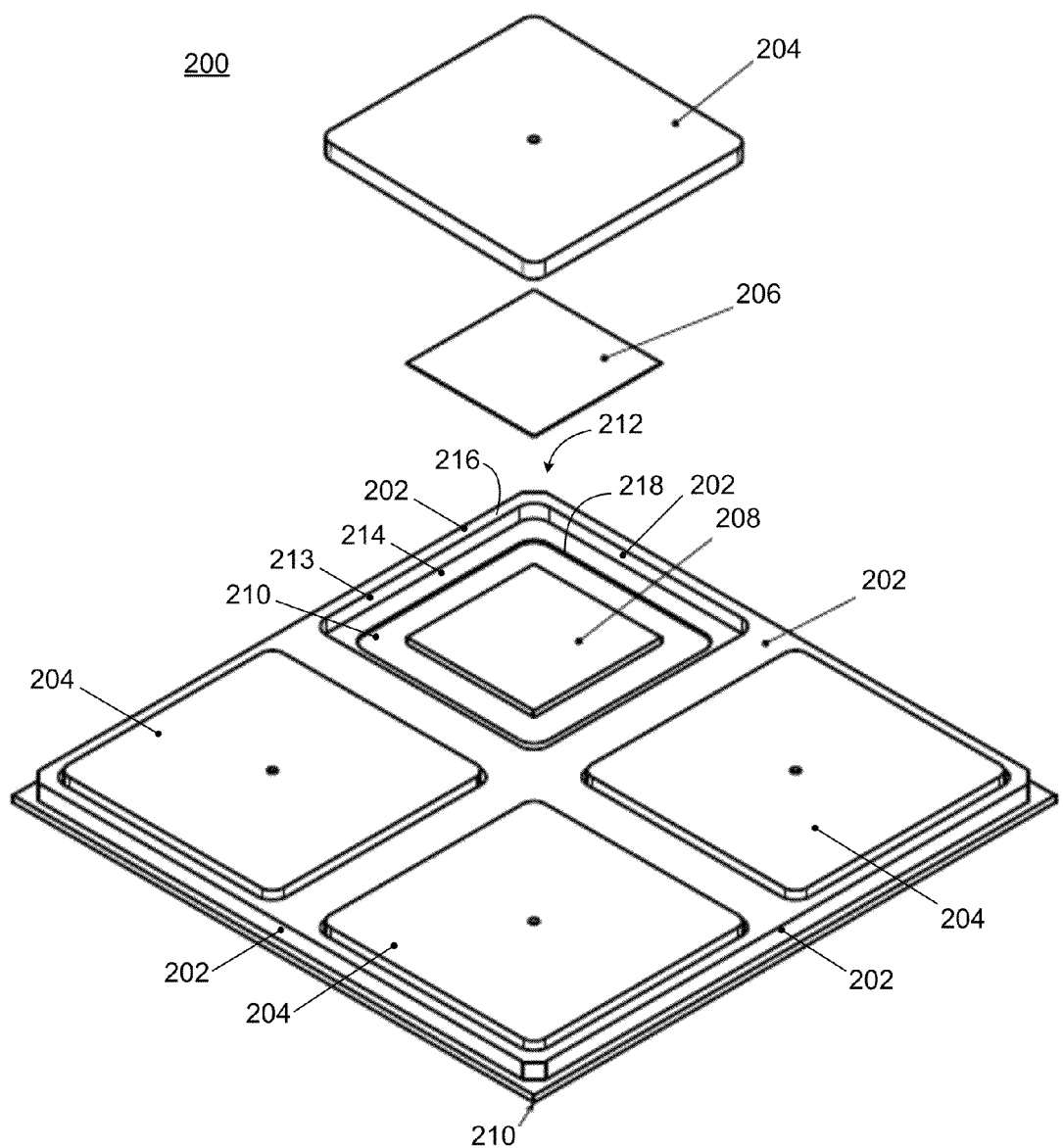
FIG. 2 depicts a multichip module according to one or more embodiments of the present invention.

FIG. 2 depicts an exemplary multichip module 200 according to various embodiments of the present invention. Multichip module 200 may include a stiffening frame 202, a plurality of covers 204, a plurality of thermal interface materials 206, a plurality of chips 208, and a carrier 210.

Carrier 210 provides a base on which the plurality of chips 208 are mounted and electrically connected thereto via a plurality of interconnects 312 (e.g. solder, pillars, wire bonds, etc.). Carrier 210 may be composed of ceramics or organic materials. If organic, carrier 210 may include multiple layers of metallization and dielectric materials. Depending upon the configuration of layers, carrier 210 may be a coreless, thin core, or standard core design. The dielectric materials may be, for example, epoxy resin with or without fiberglass fill. In various embodiments, carrier 210 may interconnect with other devices such as a socket (pin grid array, land grid array, ball grid array, etc.). In various embodiments, carrier 210 may include other devices besides chips 208, for example, surface mount devices (e.g. capacitors, resistors, etc.).

Chip 208 may be for example a microchip, microprocessor, graphic processor, combined processor and graphics processor, application specific integrated circuit (ASIC), system on a chip (SOC), three dimensional integrated circuit, system on insulator (SOI), etc. Because multichip module 200 utilizes a plurality of chips 208, in one embodiment, multichip module 200 may utilize a homogenous chip set wherein an individual chip 208 is similar to another chip 208. In another embodiment, multichip module 200 may utilize a heterogeneous chip set wherein an individual chip 208 is different from another chip 208. In another embodiment, multichip module 200 may utilize a combination homogenous and heterogeneous chip set where one or more of a first chip 208 is utilized with one or more of a second chip 208.

Carrier 210 includes stiffening frame 202 that is attached to carrier 210 using a compliant adhesive material in order to compensate for various electronic device and/or multichip module 200 component coefficient of thermal expansion (CTE) mismatches. Stiffening frame 202 improves carrier 210 flatness, and in particular improves the flatness of the underside of carrier 210. The flatness of carrier 210 at least partially allows for more efficient assembly or installation of multichip module 200 to the next level of assembly (e.g. motherboard 302, etc.). Compliant thermal interface material 310 is dimensionally compliant material that allows for dimensional expansion due to temperature. Stiffening frame 202 provides mechanical support for carrier 210 and may be particular advantageous in those applications where carrier 210 is relatively thin (e.g. coreless, thin core, etc.). Stiffening frame 202 may be made utilizing materials with a desirable mechanical strength (e.g. copper, nickel, stainless steel, titanium, aluminum, molded plastics, ceramics, composites or combinations of each, etc.). Stiffening frame 202 may be made utilizing materials with a desirable CTE (e.g. similar CTE as carrier 210, etc.). Stiffening frame 202 may be made by forging, plating, stamping, molding, casting, machining, etc.

Stiffening frame 202 includes a plurality of openings 212. Generally, there are as many openings 212 as potential chips 208. In certain embodiments, opening 212 may include an outer perimeter 216 and an inner perimeter 218. Opening 212 is configured to accept a cover 204 and chip 208. For example, outer perimeter 216 is sufficiently large to accept cover 204 and inner perimeter 218 is sufficiently large to accept chip 208. Generally, outer perimeter 216 has a greater diameter, width, etc. than inner perimeter 218. In certain embodiments, stiffening frame 202 is configured so that openings 212 are generally arranged so as to be substantially concentric with chips 208 (e.g. the dimension from the perimeter of chip 208 to inner perimeter 218 is substantially similar, etc.)

In certain embodiments, opening 212 may also include riser 213 and tread 214 along its perimeter. Generally, riser 213 and tread 214 provide surfaces to which to apply adhesive, in order to attach cover 204 to stiffening frame 202. Tread 214 is a surface formed by the bounds of outer perimeter 216 and inner perimeter 218. The surface of tread 214 is generally coplanar with the top surface of chip 208 and may be utilized to mechanically support cover 204 so as to be in thermal contact with chip 208. Riser 213 is a generally vertical surface formed by the bounds of tread 214 and the top surface of stiffening frame 202. In certain embodiments, the height of riser 213 is less than the height of cover 204 (e.g. the height of riser 213 is one quarter (¼) or one half (½) the height of cover 204, etc.). In another embodiment, the height of riser 213 is approximately equal to the height of cover 204. In certain embodiments, riser 213 and tread 214 are generally perpendicular relative to one another.

In various embodiments, multichip module 200 includes a plurality of covers 204. When attached to multichip module 200, covers 204 are juxtaposed within openings 212. As such, the outer diameter, width, etc. of cover 204 is less than the diameter, width, etc. of outer perimeter 216. In an embodiment, cover 204 is attached to stiffening frame 202 with an adhesive applied to riser 213 and/or tread 214. In certain embodiments, covers 204 are thermally attached to chips 208. Therefore, covers 204 may transfer heat away from chips 208. In various embodiments, cover 204 may be made utilizing materials having high thermal conductivity (e.g. copper, nickel, stainless steel, titanium, aluminum, etc.). In various embodiments, the number of covers 204 is similar to the number of chips 208. In other embodiments, the number of covers 204 is similar to the number of openings 212.

Multichip module 200 may include thermal interface material 206 layers juxtaposed between chips 208 and covers 204. Thermal interface material 206 generally reduces air gaps between chip 208 and cover 204, thereby increasing heat transfer away from chip 208. Thermal interface material 206 may be a thermal gel, thermal compound, thermal paste, heat paste, etc. In various embodiments, each chip 208 of multichip module 200 may be thermally joined to an associated cover 204 with the same thickness of thermal interface material 206. In other embodiments, the various thermal interface materials 206 may be of differing thicknesses. In yet another embodiment, the thickness of thermal interface materials 206 are generally minimized. In certain embodiments, thermal interface material 206 is composed of metallic materials, such as silicone rubber mixed with aluminum and zinc oxide. Other compliant base materials other than silicone rubber and thermally conductive materials may be used.

In some embodiments, high power chips 208 of differing heights may be utilized. To maximize heat transfer from the chips 208, it is advantageous to utilize a thin thermal interface material 206. Utilizing multiple covers 204, rather than a single monolithic cover for the chips, allows an individualized configuration per each chip 208 for the utilization of a thin, or minimized, thermal interface material 206 for increasing the heat transfer away from chips 208. In some embodiments, where heat transfer away from power chips 208 is less critical, various thickness of thermal interface material 206 may be utilized to achieve cover 204 top surface planarity.

Figure 3:
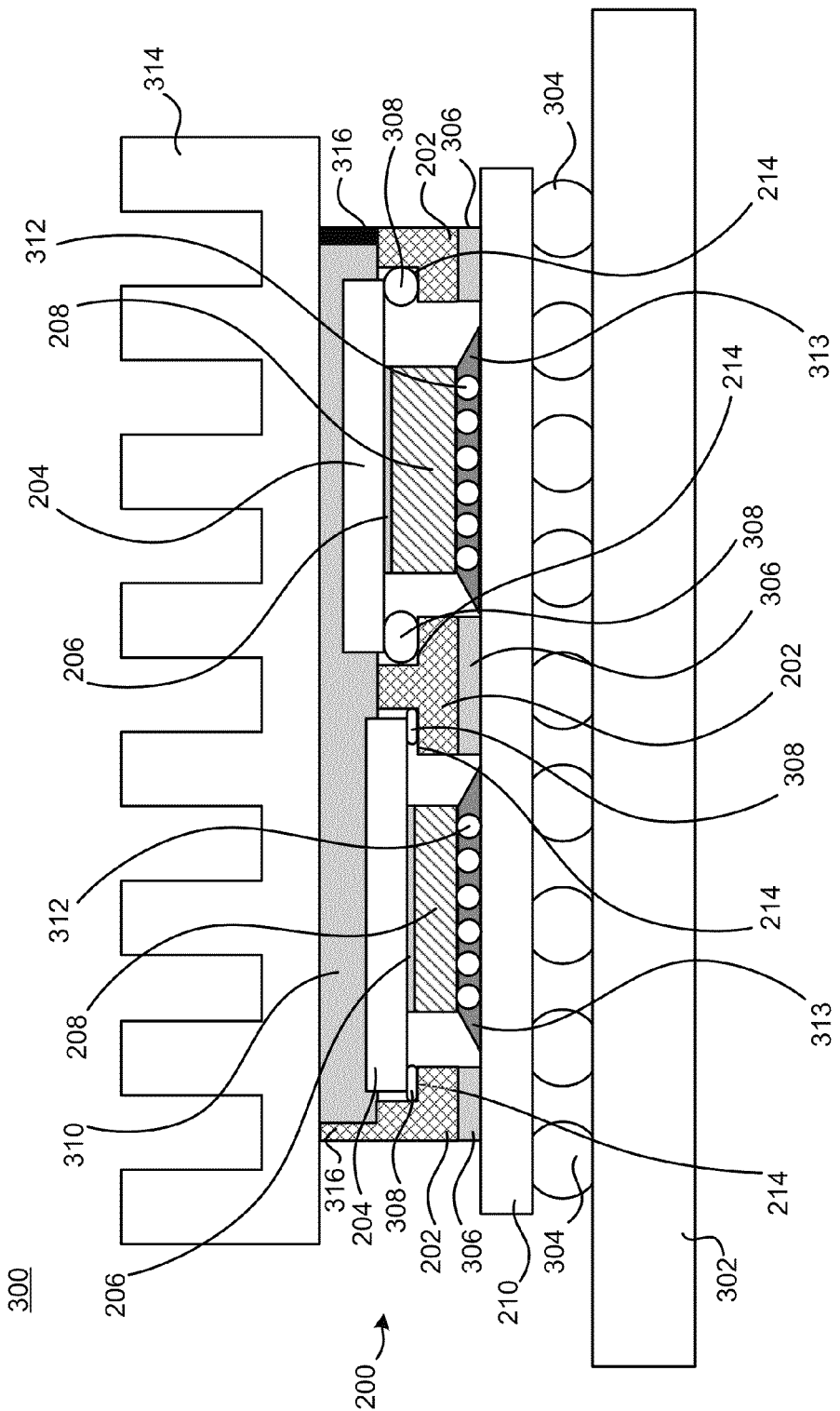
FIG. 3 depicts an electronic device utilizing a multichip module according to one or more embodiments of the present invention.

FIG. 3 depicts an electronic device 300 utilizing multichip module 200 according to various embodiments of the present invention. Electronic device 100 may be for example a computer, server, mobile device, tablet, etc. The exemplary multichip module 200 shown in FIG. 3 includes a heterogeneous chip set wherein the height of the first chip 208 is different from the second chip 208. As shown in FIG. 3, multichip module 200 may further include interconnects 312 and underfill 313.

Interconnects 312 electrically connect chips 208 and carrier 210 and may be a wire bond, solder bond, stud, conductive ball, conductive button, etc. In certain embodiments interconnects 312 may be solder joints composed of lead, lead-free, or a combination material. Underfill 313 may be electrically-insulating, may substantially surround interconnects 312, may isolate individual interconnects 312, and may provide mechanical support between chips 208 and carrier 210. Underfill 313 may also prevent damage to individual interconnects 312 due to thermal expansion mismatches between chip 208 and carrier 210. In certain embodiments, known epoxy or other resins may be used for underfill 313.

When chips 208 are seated upon carrier 210, a reflow process may be performed to join interconnects 312 to electrical contacts of chip 208 and carrier 210. After chips 208 are seated to carrier 210, covers 204 are attached to stiffening frame 202 with adhesive 308.

Multichip module 200 may be connected to a motherboard 302 via interconnects 304. Motherboard 302 may be the main printed circuit board of electronic device 300 and includes electronic components, such as a graphics processing unit, memory, etc. and provides connectors for other peripherals. Interconnects 304 electrically connect carrier 210 to motherboard 302 and may be a wire bond, solder bond, stud, conductive ball, conductive button, etc. Interconnects 304 may be larger and more robust than interconnects 312. When multichip module 200 is seated upon motherboard 302 a second reflow process may be performed to join interconnects 304 to electrical contacts of both carrier 210 and motherboard 302.

To assist in the removal of heat from chips 208 a heat sink 314 may be thermally joined to multichip module 200 via compliant thermal interface material 310. Heat sink 314 may be a passive heat exchanger that cools chips 208 by dissipating heat into the surrounding air. Heat sink 314 may also be an active heat exchanger (i.e. forced air, forced liquid cooling system, etc.). As such, during operation of electronic device 300, a thermal path exists from chips 208 to heat sink 314 through thermal interface material 206, respective covers 204, and compliant thermal interface material 310, etc. Heat sink 314 may be connected to motherboard 302 via one or more connection mechanisms as is known in the art.

To compensate for the differing heights of chips 208, a variable amount of adhesive 308 may be applied to riser 213 and/or tread 214 associated with each respective chip 208. That is, a relatively larger amount of adhesive 308 may be applied to such tread 214 so as to adequately fill such gap and attach cover 204 stiffening frame 202. In this example, the top surfaces of covers 204 may not be coplanar.

Compliant thermal interface material 310 is dimensionally compliant and typically a thick enough layer of thermal interface material to compensate for a potential lack of cover 204 coplanarity while maintaining a thermal path between covers 204 and of heat sink 314. Cover 204 coplanarity may be lacking, for example, where chips 208 of different heights are utilized, covers 204 of different heights are utilized, treads 214 of various openings 212 lack coplanarity, etc. Compliant thermal interface material 310 is typically thicker layer as compared to thermal interface material 206. In an embodiment, the amount of compliant thermal interface material 310 is proportional to the difference between the top surfaces of covers 204. Typically, compliant thermal interface material 310 increases heat transfer from covers 204 and heat sink 314 by reducing air gaps there between. In certain embodiments may be composed of polymeric base material such as, for example, silicone rubber mixed with aluminum particles and zinc oxide, though other specific materials may be utilized (e.g. thermal grease, thermal gel, thermal paste, etc.).

In various embodiments, multichip module 200 may also include a barrier 316 (e.g. a second tread & riser, a perimeter riser, etc.) to adequately retain compliant thermal interface material 310. For example, barrier 316 may generally span the entire perimeter of stiffening frame 202 to retain thermal interface material 310. In various embodiments, barrier 316 may be part of stiffening member 202. In other embodiments, barrier 316 is a separate part from stiffening member 202, and is attached to stiffening member 202 during manufacturing. In this embodiment, barrier may be formed from a lightweight material such as a molded plastic. In some embodiments, the top surface of barrier 316 may be substantially coplanar with the top surface of the tallest chip 208. In other embodiments, the height of barrier 316 is sufficient to mechanically support heat sink 314. Though barriers 316 are shown as different embodiments, barriers 316 may similar (i.e. part of stiffening member 202, separate part, etc.).

Figure 4:
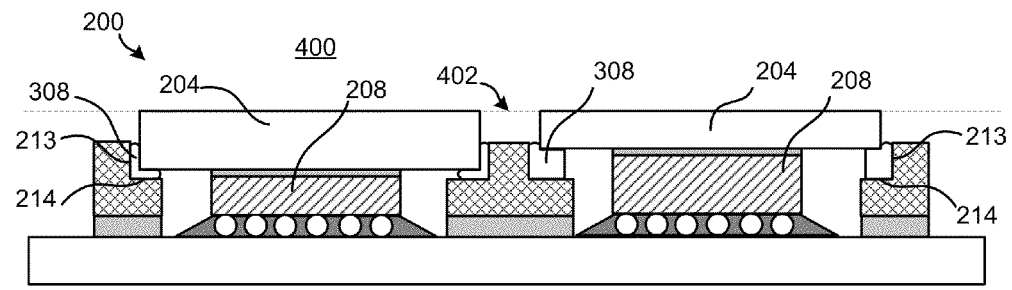
FIGS. 4-11 depict alternative multichip modules according to various embodiments of the present invention.

FIG. 4 depicts an alternative multichip module 200 according to various embodiments of the present invention. In the present example, multichip module 200 includes chips 208 of various heights. To compensate for chip 208 height differential, covers 204 having various heights may be utilized. For example, a smaller height cover 204 may be utilized with the taller chip 208 and a larger height cover 204 may be utilized with the shorter ship 208. In certain embodiments, by utilizing covers of various thicknesses, the top surfaces of covers 204 may lay on a similar plane 402. Also shown in the present example, adhesive 308 may be placed on both riser 213 and tread 214 to attach covers 204 to stiffening frame 202.

Figure 5:
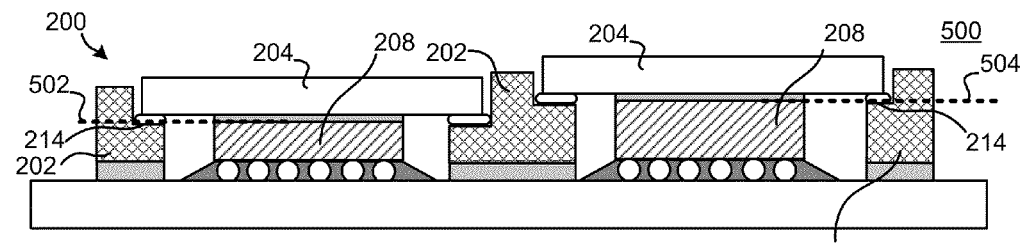

FIG. 5 depicts an alternative multichip module 200 according to various embodiments of the present invention. In the present example, multichip module 200 also includes chips 208 of various heights. To compensate for chip 208 height differential, treads 214 of stiffening frame 202 are configured at different heights. Treads 214 for each chip 208 may exist at different planes, treads 214 exist on plane 502 and plane 504 respectively. In some embodiments, tread 214 and the top of the shorter chip 208 may be substantially coplanar on plane 502 and tread 214 and the top of the taller chip 208 may also be substantially coplanar on plane 504. However, in other embodiments (i.e. those when adhesive 308 is a compliant adhesive, those where the thickness of thermal interface material 206 is minimized, etc.) treads 214 may be below the top of chips 208.

Figure 6:
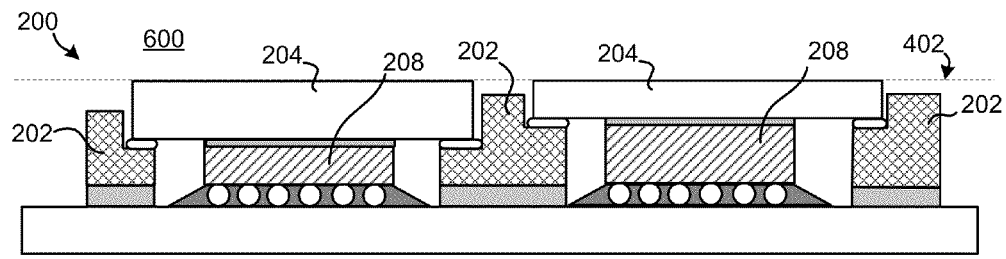

FIG. 6 depicts an alternative multichip module 200 according to various embodiments of the present invention. In the present example, multichip module 200 also includes chips 208 of various heights. To compensate for chip 208 height differential, covers 204 of various heights may be utilized along with treads 214 existing on differing planes, i.e. plane 502 and plane 504 respectively. By utilizing covers 204 of various thicknesses along with treads 214 existing on different planes, the top surfaces of covers 204 may be configured lay on a similar plane 402.

Figure 7:
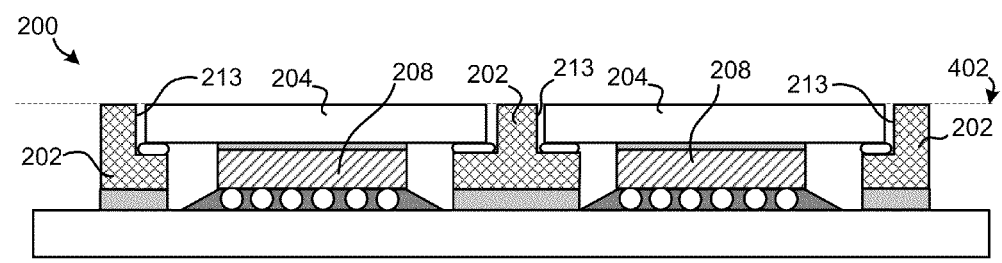

FIG. 7 depicts an alternative multichip module 200 according to various embodiments of the present invention. In the present example, risers 213 are of sufficient height such that the top surface of stiffening frame 202 and the top surface of covers 204 are coplanar upon plane 402. The example depicted in FIG. 7 may be generally beneficial for providing a large flat surface to which to attach heat sink 314.

Figure 8:
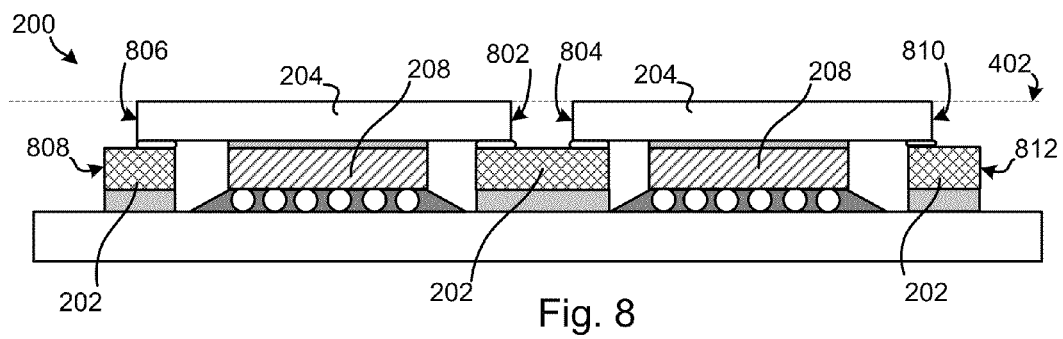

FIG. 8 depicts an alternative multichip module 200 according to various embodiments of the present invention. In the present example, stiffening frame 202 does not include risers 213, riser portion, etc. Rather, the top surface of stiffening frame 202 is generally flat. As shown, covers 204 sufficiently conceal openings 212. In certain embodiments, side 806 and 810 of covers 204 may extend to side 808 and 812 of stiffening frame 202, respectively. Further, side 802 of cover 204 and side 804 of cover 204 may be sufficiently coincident. As such, the top surfaces of covers 204 are coplanar upon plane 402 and may generally form a large flat surface to which to attach heat sink 314.

Figure 9:
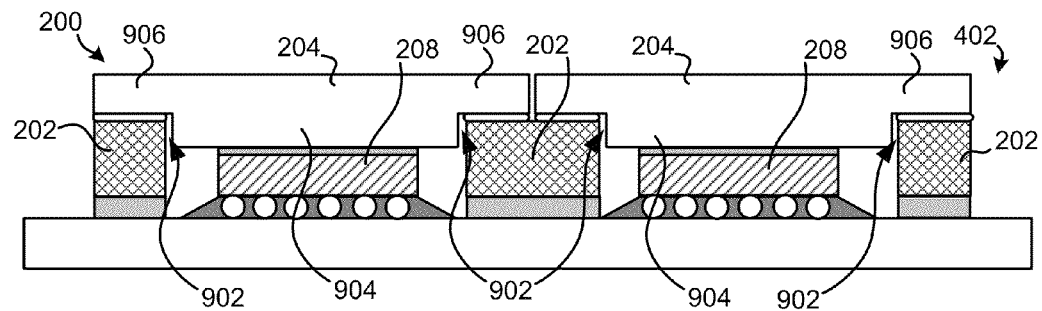

FIG. 9 depicts an alternative multichip module 200 according to various embodiments of the present invention. In the present example, covers 204 include step 902. Step 902 thereby forms an inner portion 904 that may extend into opening 212 and an outer portion 906 that extends beyond the perimeter of opening 212 that may be utilized to attach covers 204 to stiffening frame 202. In certain embodiments, step 902 forms a flange, etc. The width/diameter of inner portion 904 may be slightly smaller that the width/diameter of opening 212. As such, inner portion 904 may serve to align covers 204 into opening 212 during installation. In the present example, the top surfaces of covers 204 are again coplanar upon plane 402 and may generally form a large flat surface to which to attach heat sink 314

Figure 10:
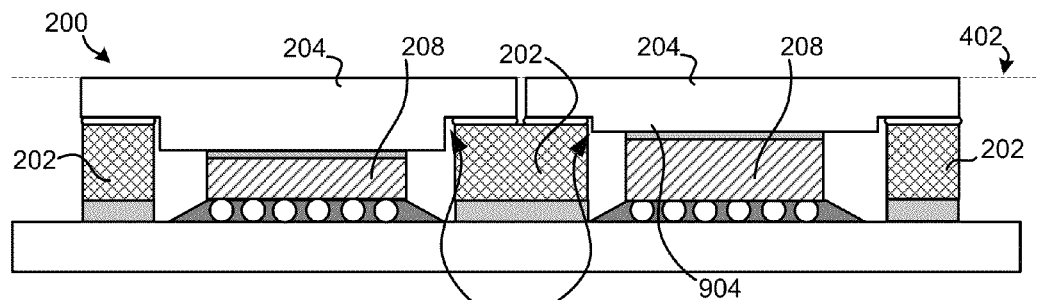

FIG. 10 depicts an alternative multichip module 200 according to various embodiments of the present invention. In the present example, multichip module 200 includes chips 208 of various heights. To account for the chip 208 height differential, the height of inner portion 904 of cover 204 may be adjusted. For example, the height of inner portion 904 may be shortened on cover 204 associated with the tall chip 208. In the present example, the top surfaces of covers 204 are again coplanar upon plane 402 and may generally form a large flat surface to which to attach heat sink 314

Figure 11:
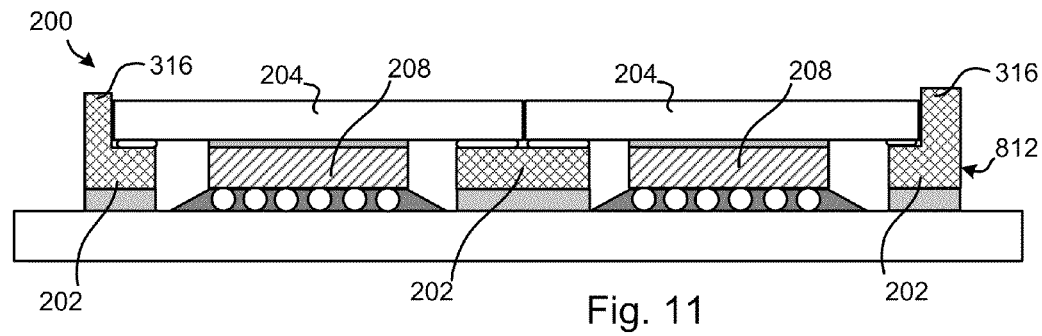

FIG. 11 depicts an alternative multichip module 200 according to various embodiments of the present invention. In the present example, stiffening frame 202 includes barrier 316 along the perimeter of stiffening frame 202. While barrier 316 provides retention of thermal interface material 310, in the present example it may also serve as a perimeter retainer for covers 204.

Figure 12:
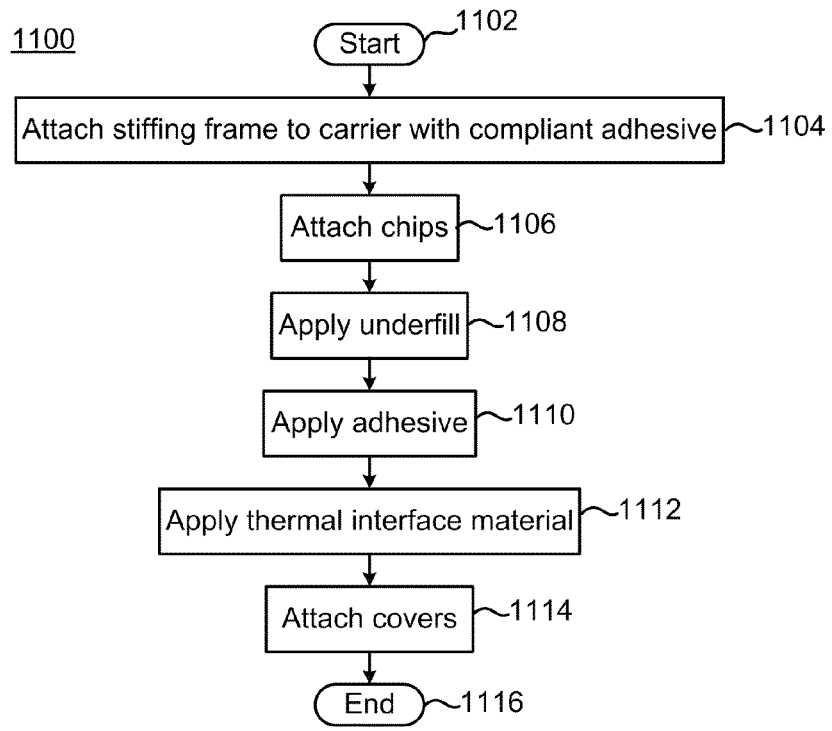
FIG. 12 depicts a method for manufacturing a multichip module according to one or more embodiments of the present invention.

FIG. 12 depicts a method 1100 for manufacturing a multichip module 200 according to various embodiments of the present invention. Method 1100 begins at block 1102. In certain embodiments, a stiffening frame 202 is attached to carrier 210 with a compliant adhesive 306 (block 1104). When being attached, stiffening frame 202 may be aligned with carrier 210 such that openings 212 are substantially concentric with chips 208 or, if chips 208 are not yet installed, with locations to which chips 208 will be attached. In certain embodiments, the compliant adhesive 306 may be applied to the underside of stiffening frame 202 or the compliant adhesive 306 may be applied to carrier 210. Depending upon the type of compliant adhesive 306, an adhesive curing process may be advantageous.

In certain embodiments, the chips 208 are attached to carrier 210 (block 1106) by way of interconnects 312 and underfill 313 is applied (block 1108). In certain embodiments chips 208 are attached using a solder bump processes including a solder reflow. Underfill 313 may be applied by capillary deposition or some other technique. In some embodiments, underfill 313 may be subject to a curing process. The curing of underfill 313 may or may not coincide with the curing of compliant adhesive 306. In some embodiments, block 1106 and block 1108 may be performed prior to block 1104. That is, stiffening frame 202 may be attached to carrier 210 before, during, or after chips 208 are attached and/or underfill 313 is deposited.

Adhesive 308 may be applied to stiffening frame 202 (block 1110). For example, adhesive 308 may be applied to the perimeter of openings 212. In another example, adhesive 308 may be applied to tread 214 and/or riser 213. Alternatively and/or in addition to block 1110, adhesive 308 may be applied to the underside of covers 204. For example, adhesive 308 may be applied to the underside perimeter of covers 204. In another example, adhesive 308 may be applied to step 902 of covers 204. If polymeric, adhesive 308 may be applied by bush, dispenser, etc. In various embodiments, thermal interface material 206 may be applied to chips 208 and/or the underside of covers 204 (block 1112). Covers 204 are attached to stiffening frame 202 (block 1114). When being attached, covers 204 may be concentrically aligned with openings 212. Depending upon the type of compliant adhesive 308, an adhesive curing process may be advantageous. The curing of adhesive 308 may or may not coincide with the curing of compliant adhesive 306 and/or underfill 313. In certain embodiments, method 1100 also includes application of barrier 316. Method 1100 ends at block 1116.

Figure 13:
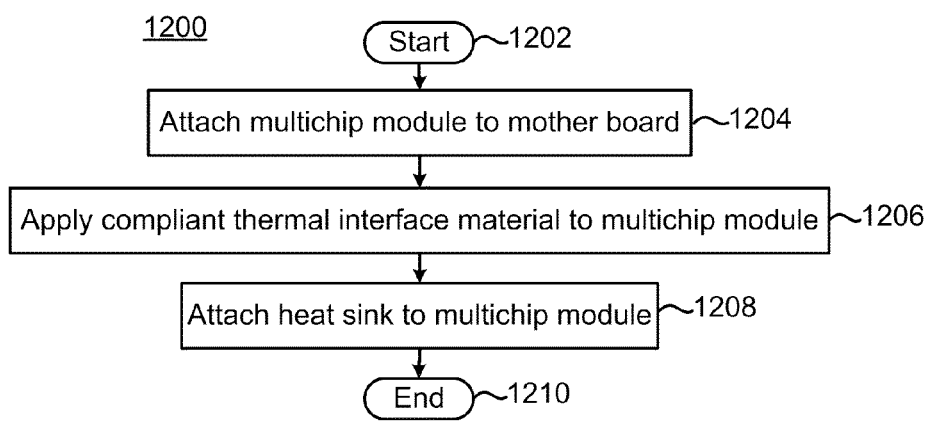
FIG. 13 depicts a method for installing a multichip module into an electronic device according to one or more embodiments of the present invention.

FIG. 13 depicts a method 1200 for installing a multichip module 200 into an electronic device 300 according to various embodiments of the present invention. Method 1200 begins at block 1202. In certain embodiments, multichip module 200 is attached to motherboard 302 via interconnects 304 (block 1204). As addressed above, multichip module 200 may be attached using a solder bump processes including a solder reflow; and in other embodiments, multichip module 200 may be attached to motherboard 302 via a land grid array or ball grid array socket, or other interconnection scheme.

A compliant thermal interface material 310 is applied to multichip module 200 (block 1206). For example, compliant thermal interface material 310 may be injected, painted, spread, or otherwise applied to the top surface of covers 204 and/or the top surface of stiffening frame 202. In certain embodiments, compliant thermal interface material 310 is applied in an area within barrier 316.

Heat sink 314 may be attached to multichip module 200 (block 1208). For example, heat sink 314 may be attached utilizing thermal interface material 310, thermal tape, epoxy, clip(s), stand offs, etc. Generally, a force may be applied to secure heat sink 314 to multichip module 200. In another example, a connection device 130 may be utilized to attach heat sink 314 to multichip module 200.

Figure 14:
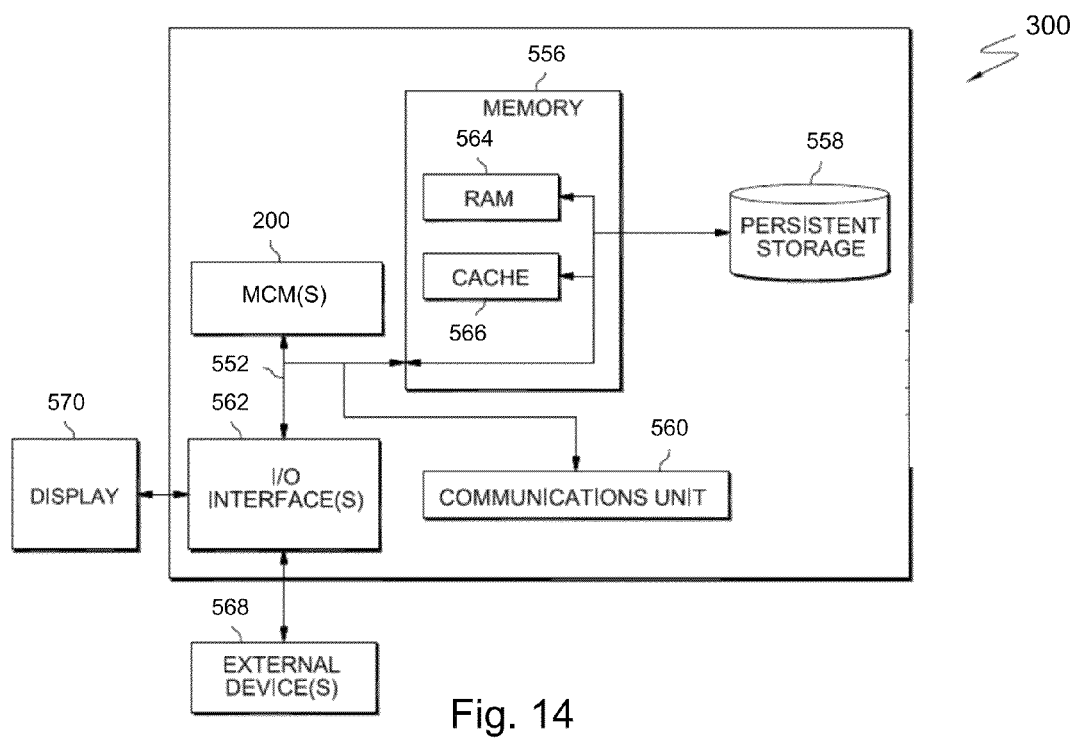
FIG. 14 depicts a block diagram of an exemplary electronic device that utilizes a multichip module according to one or more embodiments of the present invention.

FIG. 14 depicts a block diagram of an exemplary electronic device 300 that may utilize a multichip module 200 according to an embodiment of the present invention. It should be appreciated that FIG. 13 provides only an illustration of one implementation of an embodiment of the present invention and does not imply any limitations with regard to the environment in which different embodiments may be implemented.

Electronic device 300 includes communications bus 552, which provides communications between multichip module(s) 200, memory 556, persistent storage 558, communications unit 560, and input/output (I/O) interface(s) 562. Memory 556 may be, for example, one or more random access memories (RAM) 564, cache memory 566, or any other suitable non-volatile or volatile storage device. Persistent storage 558 can include one or more of flash memory, magnetic disk storage device of an internal hard drive, a solid state drive, a semiconductor storage device, read-only memory (ROM), EPROM, or any other computer-readable tangible storage device that is capable of storing program instructions or digital information.

The media used by persistent storage 558 may also be removable. For example, a removable hard drive may be used for persistent storage 558. Other examples include an optical or magnetic disk that is inserted into a drive for transfer onto another storage device that is also a part of persistent storage 558, or other removable storage devices such as a thumb drive or smart card.

Communications unit 560 provides for communications with other electronic devices. Communications unit 560 includes one or more network interfaces. Communications unit 560 may provide communications through the use of either or both physical and wireless communications links. In other embodiments, electronic device 200 may be devoid of communications unit 560. Software may be downloaded to persistent storage 558 through communications unit 560.

I/O interface(s) 562 allows for input and output of data with other devices that may be connected to electronic device 200. For example, I/O interface 562 may provide a connection to external devices 568 such as a camera, mouse, keyboard, keypad, touch screen, and/or some other suitable input device. I/O interface(s) 562 also connects to display 570.

Display 570 provides a mechanism to display data to a user and may be, for example, a computer monitor. Alternatively, display 570 may be integral to electronic device 200 and may also function as a touch screen.

The accompanying figures and this description depicted and described embodiments of the present invention, and features and components thereof. Those skilled in the art will appreciate that any particular program nomenclature used in this description was merely for convenience, and thus the invention should not be limited to use solely in any specific application identified and/or implied by such nomenclature. Thus, for example, the routines executed to implement the embodiments of the invention, whether implemented as part of an operating system or a specific application, component, program, module, object, or sequence of instructions could have been referred to as a "program", "application", "server", or other meaningful nomenclature. Therefore, it is desired that the embodiments described herein be considered in all respects as illustrative, not restrictive, and that reference be made to the appended claims for determining the scope of the invention.

The invention claimed is:

1. A multichip module comprising:
   a carrier comprising:
      a top surface and a bottom surface configured to be electrically connected to a motherboard;
   a stiffening frame attached to the top surface with an compliant adhesive that absorbs thermally induced dimensional variations between the stiffening frame and the carrier, the stiffening frame comprising:
      a plurality of openings that accept the plurality of semiconductor chips;
   a plurality of semiconductor chips electrically connected to the top surface and concentrically arranged within the plurality of openings, and;
   a plurality of covers attached to the stiffening frame that enclose the plurality of openings.

2. The multichip module of claim 1 wherein at least a first cover is in thermal contact with a first semiconductor chip.

3. The multichip module of claim 1 wherein the stiffening frame further comprises:
   a thermal interface material barrier upon a top surface of the stiffening frame perimeter.

4. The multichip module of claim 1 wherein each cover comprises a top surface and wherein the top surface of a first cover is coplanar with the top surface of a second cover.

5. The multichip module of claim 1 wherein each cover comprises a top surface and wherein the top surface of a first cover is non-planar with the top surface of a second cover.

6. The multichip module of claim 1 wherein each cover comprises a top surface, wherein the stiffening frame comprises a top surface, and wherein the top surface of a first cover is coplanar with the top surface of the stiffening frame.

7. The multichip module of claim 1 wherein the plurality of semiconductor chips are arranged in a homogenous chipset.

8. The multichip module of claim 1 wherein the plurality of semiconductor chips are arranged in a heterogeneous chipset.

* * * * *